US012793789B2

(12) United States Patent
Mun et al.

(10) Patent No.: US 12,793,789 B2
(45) Date of Patent: Nov. 10, 2026

(54) SEMICONDUCTOR MEMORY DEVICE FOR PERFORMING PROGRAM OPERATION USING MULTIPLE VERIFY VOLTAGES

(71) Applicant: SK hynix Inc., Gyeonggi-do (KR)

(72) Inventors: Yeong Jo Mun, Gyeonggi-do (KR); Kang Woo Park, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 237 days.

(21) Appl. No.: 18/450,135

(22) Filed: Aug. 15, 2023

(65) Prior Publication Data

US 2024/0290393 A1 Aug. 29, 2024

(30) Foreign Application Priority Data

Feb. 23, 2023 (KR) ........................ 10-2023-0024499

(51) Int. Cl.

| | |
|---|---|
| ***G11C 16/24*** | (2006.01) |
| ***G11C 7/10*** | (2006.01) |
| ***G11C 7/12*** | (2006.01) |
| ***G11C 11/56*** | (2006.01) |
| ***G11C 16/04*** | (2006.01) |

(Continued)

(52) U.S. Cl.

CPC ............ *G11C 16/24* (2013.01); *G11C 7/1084* (2013.01); *G11C 7/1087* (2013.01); *G11C 7/12* (2013.01); *G11C 11/5628* (2013.01); *G11C 16/0483* (2013.01); *G11C 16/10* (2013.01); *G11C 16/3436* (2013.01); *G11C 16/3459* (2013.01)

(58) Field of Classification Search

CPC . G11C 16/24; G11C 11/5628; G11C 16/0483; G11C 16/10; G11C 16/3459; G11C 16/3436; G11C 7/1084; G11C 7/1087; G11C 7/12

See application file for complete search history.

(56) References Cited

U.S. PATENT DOCUMENTS 10,629,277 B2 * 4/2020 Chai ...................... G11C 16/26
2010/0329020 A1 * 12/2010 Han .................... G11C 11/5628 365/185.25
2017/0125087 A1 * 5/2017 Masuduzzaman ........................... G11C 11/5628

(Continued)

FOREIGN PATENT DOCUMENTS

KR 102021684 B1 9/2019
KR 1020200139496 A 12/2020

*Primary Examiner* — Alexander Sofocleous
*Assistant Examiner* — Joseph Fidelis Stormes
(74) *Attorney, Agent, or Firm* — IP&T GROUP LLP

(57) ABSTRACT

Provided herein may be a semiconductor memory device. The semiconductor memory device may include a memory cell array including a plurality of memory cells, a plurality of page buffers respectively coupled to the plurality of memory cells through bit lines, and a control logic configured to control a program operation of each of the plurality of page buffers. Each of the plurality of page buffers may include a first latch circuit configured to store first data indicating a main verification result obtained using a main verify voltage, a second latch circuit configured to store second data indicating a first sub-verification result obtained using a first sub-verify voltage lower than the main verify voltage, and a third latch circuit configured to store third data indicating a second sub-verification result obtained using a second sub-verify voltage lower than the first sub-verify voltage.

8 Claims, 8 Drawing Sheets

131a

(51) Int. Cl.
*G11C 16/10* (2006.01)
*G11C 16/34* (2006.01)

(56) References Cited

U.S. PATENT DOCUMENTS

| | | | | |
|---|---|---|---|---|
| 2017/0140823 | A1* | 5/2017 | Missiroli | G11C 16/26 |
| 2022/0230690 | A1* | 7/2022 | Chai | G11C 11/5628 |
| 2022/0270697 | A1* | 8/2022 | Hwang | G11C 11/5642 |

* cited by examiner

| | |
|---|---|
| $BL_A$ | VSS |
| $BL_B$ | VREF1 |
| $BL_C$ | VREF2 |
| $BL_D$ | Vinh |

| | A | B | C | D |
|---|---|---|---|---|
| QS_N | 0 | 0 | 0 | 1 |
| QM_N | 0 | 0 | 1 | 1 |
| QT_N | 0 | 1 | 1 | 1 |

DATA TRANSFER (LT→LS)

| | A | B | C | D |
|---|---|---|---|---|
| QS_N | 0 | 1 | 1 | 1 |
| QM_N | 0 | 0 | 1 | 1 |
| QT_N | 0 | 1 | 1 | 1 |

SEMICONDUCTOR MEMORY DEVICE FOR PERFORMING PROGRAM OPERATION USING MULTIPLE VERIFY VOLTAGES

CROSS-REFERENCE TO RELATED APPLICATION

The present application claims priority under 35 U.S.C. § 119(a) to Korean patent application number 10-2023-0024499 filed on Feb. 23, 2023, the entire disclosure of which is incorporated by reference herein.

BACKGROUND

1. Field of Invention

Various embodiments of the present disclosure relate to an electronic device, and more particularly to a semiconductor memory device for performing a program operation.

2. Description of Related Art

A semiconductor memory device may be formed in a two-dimensional (2D) structure in which strings are horizontally arranged on a semiconductor substrate. Alternatively, the semiconductor memory device may be formed in a three-dimensional (3D) structure in which strings are vertically stacked on a semiconductor substrate. As a memory device having a 2D structure is reaching its physical scaling limit (i.e., limit in the degree of integration), a 3D memory device including a plurality of memory cells vertically stacked on a semiconductor substrate has been produced.

During a program operation on selected memory cells, a plurality of program loops may be performed on the selected memory cells. Each of the program loops may include a first sub-verify operation, a second sub-verify operation, and a main verify operation. The first sub-verify operation includes an operation of sensing the threshold voltages of memory cells using a first sub-verify voltage lower than a main verify voltage used for the main verify operation. The second sub-verify operation includes an operation of sensing the threshold voltages of memory cells using a second sub-verify voltage lower than the first sub-verify voltage used for the first sub-verify operation. The threshold voltage distribution characteristics of memory cells formed by the program operation may be improved by differently controlling bit line voltages of the memory cells having threshold voltages respectively corresponding to ranges divided by the first and second sub-verify voltages and the main verify voltage.

SUMMARY

Various embodiments of the present disclosure are directed to a semiconductor memory device capable of setting bit line voltages so that first and second sub-verify operations and a main verify operation are performed.

An embodiment of the present disclosure may provide for a semiconductor memory device. The semiconductor memory device may include a memory cell array including a plurality of memory cells, a plurality of page buffers coupled to the plurality of memory cells through a plurality of bit lines, and a control logic configured to control each of the plurality of page buffers during a program operation. Each of the plurality of page buffers may include a first latch circuit configured to store first data corresponding to a main verification result obtained using a main verify voltage, a second latch circuit configured to store second data corresponding to a first sub-verification result obtained using a first sub-verify voltage lower than the main verify voltage, and a third latch circuit configured to store third data corresponding to a second sub-verification result obtained using a second sub-verify voltage lower than the first sub-verify voltage. Each of the plurality of page buffers may be configured to apply a program-inhibit voltage to a bit line coupled to program-completed memory cells, using the first data stored in the first latch circuit, and store the third data, stored in the third latch circuit, in the first latch circuit after the program-inhibit voltage is applied.

An embodiment of the present disclosure may provide for page buffer. The page buffer may include a first latch circuit, a second latch circuit and a third latch circuit. The first latch circuit may be configured to store, during a program operation, first data corresponding to a main verification result obtained using a main verify voltage. The second latch circuit may be configured to store, during the program operation, second data corresponding to a first sub-verification result obtained using a first sub-verify voltage lower than the main verify voltage. The third latch circuit may be configured to store, during the program operation, third data corresponding to a second sub-verification result obtained using a second sub-verify voltage lower than the first sub-verify voltage. During the program operation, the page buffer may control the first to third latch circuits by applying a program-inhibit voltage to a bit line coupled to program-completed memory cells, using the first data stored in the first latch circuit, storing, in the first latch circuit, the third data stored in the third latch circuit, raising a voltage of a bit line coupled to memory cells having threshold voltages, lower than the main verify voltage and higher than the first sub-verify voltage, to an intermediate level using the second data, and raising a voltage of a bit line coupled to memory cells having threshold voltages, lower than the main verify voltage and higher than the second sub-verify voltage, using the third data stored in the third latch circuit and the second data.

An embodiment of the present disclosure may provide for page buffer. The page buffer may include a first latch circuit, a second latch circuit and a third latch circuit. The first latch circuit may be configured to store, during a program operation, first data corresponding to a main verification result obtained using a main verify voltage. The second latch circuit may be configured to store, during the program operation, second data corresponding to a first sub-verification result obtained using a first sub-verify voltage lower than the main verify voltage. The third latch circuit may be configured to store, during the program operation, third data corresponding to a second sub-verification result obtained using a second sub-verify voltage lower than the first sub-verify voltage. During the program operation, the page buffer may control the first to third latch circuits by applying a program-inhibit voltage to a bit line coupled to program-completed memory cells, using the first data stored in the first latch circuit, storing, in the first latch circuit, the third data stored in the third latch circuit, and raising a voltage of a bit line coupled to memory cells having threshold voltages, lower than the main verify voltage and higher than the second sub-verify voltage, using the third data stored in the third latch circuit and the second data.

DETAILED DESCRIPTION

Specific structural or functional descriptions in the embodiments of the present disclosure introduced in this specification are provided as examples to describe embodiments according to the concept of the present disclosure. The embodiments according to the concept of the present disclosure may be practiced in various forms, and should not be construed as being limited to the embodiments described in the specification.

Figure 1:
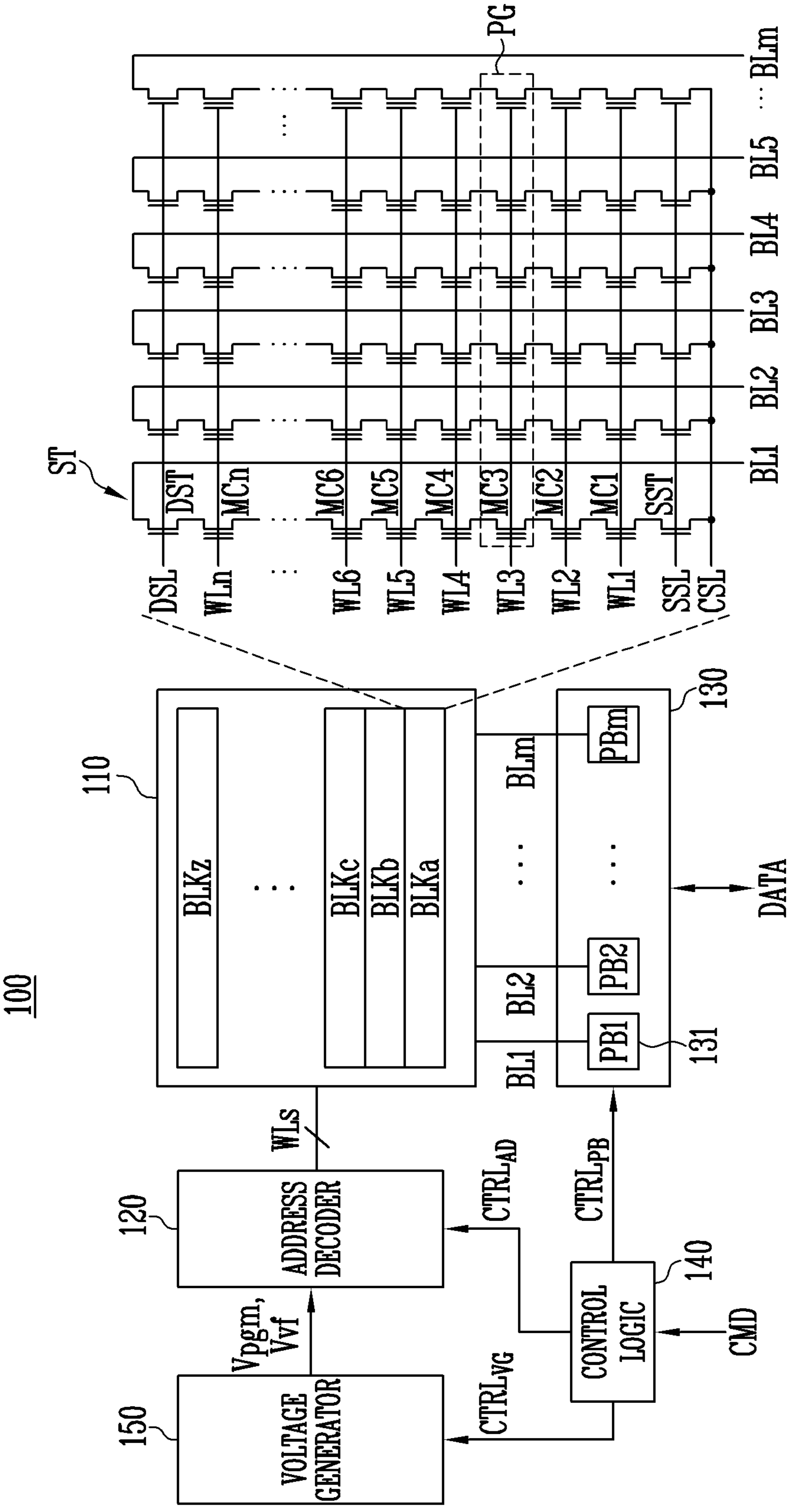
FIG. 1 is a block diagram illustrating a semiconductor memory device according to an embodiment of the present disclosure.

FIG. 1 is a block diagram illustrating a semiconductor memory device 100 according to an embodiment of the present disclosure.

Referring to FIG. 1, the semiconductor memory device 100 may include a memory cell array 110, an address decoder 120, a read and write circuit 130, a control logic 140, and a voltage generator 150.

The memory cell array 110 may include a plurality of memory blocks BLKa to BLKz. The plurality of memory blocks BLKa to BLKz may be coupled to the address decoder 120 through word lines WLs. The plurality of memory blocks BLKa to BLKz may be coupled to the read and write circuit 130 through bit lines BL1 to BLm. Each of the memory blocks BLKa to BLKz may include a plurality of memory cells. In an embodiment, the plurality of memory cells may be implemented as nonvolatile memory cells.

In FIG. 1, the structure of the memory block BLKa, among the plurality of memory blocks BLKa to BLKz included in the memory cell array, is illustrated as an example. Referring to FIG. 1, a plurality of word lines WL1 to WLn arranged in parallel to each other may be coupled between a drain select line DSL and a source select line SSL. More specifically, the memory block BLKa may include a plurality of strings ST coupled between bit lines BL1 to BLm and a common source line CSL. The bit lines BL1 to BLm may be coupled to the respective strings ST, and the common source line CSL may be coupled in common to the strings ST. Because the strings ST may have the same configuration, the string ST coupled to the first bit line BL1 will be described in detail by way of example.

The string ST may include a source select transistor SST, a plurality of memory cells MC1 to MCn, and a drain select transistor DST which are coupled in series to each other between the source line SL and the first bit line BL1. At least one source select transistor SST and at least one drain select transistor DST may be included in one string ST.

A source of the source select transistor SST may be coupled to the common source line CSL, and a drain of the drain select transistor DST may be coupled to the first bit line BL1. The memory cells MC1 to MCn may be coupled in series between the source select transistor SST and the drain select transistor DST. Gates of the source select transistors SST included in different strings ST may be coupled to the source select line SSL, gates of the drain select transistors DST included in different strings ST may be coupled to the drain select line DSL, and gates of the memory cells MC1 to MCn may be coupled to the plurality of word lines WL1 to WLn, respectively. A group of memory cells coupled to the same word line, among the memory cells included in different strings ST, may be referred to as a 'physical page (PG)'. Therefore, the memory block BLKa may include a number of physical pages (PG) identical to the number of word lines WL1 to WLn.

One memory cell may store one bit of data. This cell is typically referred to as a "single-level cell (SLC)." In this case, one physical page (PG) may store data of one logical page (LPG). The data of one logical page (LPG) may include a number of data bits identical to the number of cells included in one physical page (PG).

One memory cell may store two or more bits of data. In this case, one physical page (PG) may store data of two or more logical pages (LPG).

Although, in FIG. 1, the structure of a two-dimensional (2D) memory block is illustrated as an example, the present disclosure is not limited thereto. For example, each of the memory blocks BLKa to BLKz of FIG. 1 may be implemented as a three-dimensional (3D) memory block. The address decoder 120, the read and write circuit 130, and the voltage generator 150 are operated as a peripheral circuit for driving the memory cell array 110. The peripheral circuit may perform a read operation, a write operation, and an erase operation on the memory cell array 110 under the control of the control logic 140. The address decoder 120 is coupled to the memory cell array 110 through the word lines WLs. The address decoder 120 may operate under the control of the control logic 140. In detail, the control logic 140 may transfer an address decoding control signal $CTRL_{AD}$ to the address decoder 120, and the address decoder 120 may perform a decoding operation in response to the address decoding control signal $CTRL_{AD}$.

Further, the address decoder 120 may apply a program voltage Vpgm generated by the voltage generator 150 to a selected word line and apply a program pass voltage to the remaining word lines, that is, unselected word lines, during a program operation. Furthermore, the address decoder 120 may apply a verify voltage Vvf generated by the voltage generator 150 to the selected word line and apply a verify pass voltage to the remaining word lines, that is, unselected word lines, during a program verify operation.

The read and write circuit 130 includes a plurality of page buffers PB1 to PBm. The read and write circuit 130 may serve as a "read circuit" during a read operation on the memory cell array 110 and serve as a "write circuit" during a write operation on the memory cell array 110. The plurality of page buffers PB1 to PBm may be coupled to the memory cell array 110 through the bit lines BL1 to BLm. The read and write circuit 130 may perform a program operation on received data DATA in response to a page buffer control signal $CTRL_{PB}$ output from the control logic 140. An embodiment of the first page buffer PB1 131, among the plurality of page buffers PB1 to PBm, will be described in detail later with reference to FIG. 5.

The control logic 140 is coupled to the address decoder 120, the read and write circuit 130, and the voltage generator 150. The control logic 140 may receive a command CMD from an external device. The control logic 140 may control the address decoder 120, the read and write circuit 130, and the voltage generator 150 to perform an operation corresponding to the received command CMD. That is, the control logic 140 may control the operation of the voltage generator 150 using a voltage generation control signal $CTRL_{VG}$. Also, the control logic 140 may control the operation of the address decoder 120 using the address decoding control signal $CTRL_{AD}$. Meanwhile, the control logic 140 may control the operations of the page buffers PB1 to PBm in the read and write circuit 130 using the page buffer control signal $CTRL_{PB}$.

The voltage generator 150 may generate various operating voltages in response to the voltage generation control signal $CTRL_{VG}$ output from the control logic 140. For example, the voltage generator 150 may generate the program voltage Vpgm used for a program operation and the verify voltage Vvf used for a program verify operation. Furthermore, the voltage generator 150 may generate the program pass voltage and the verify pass voltage.

Figure 2:
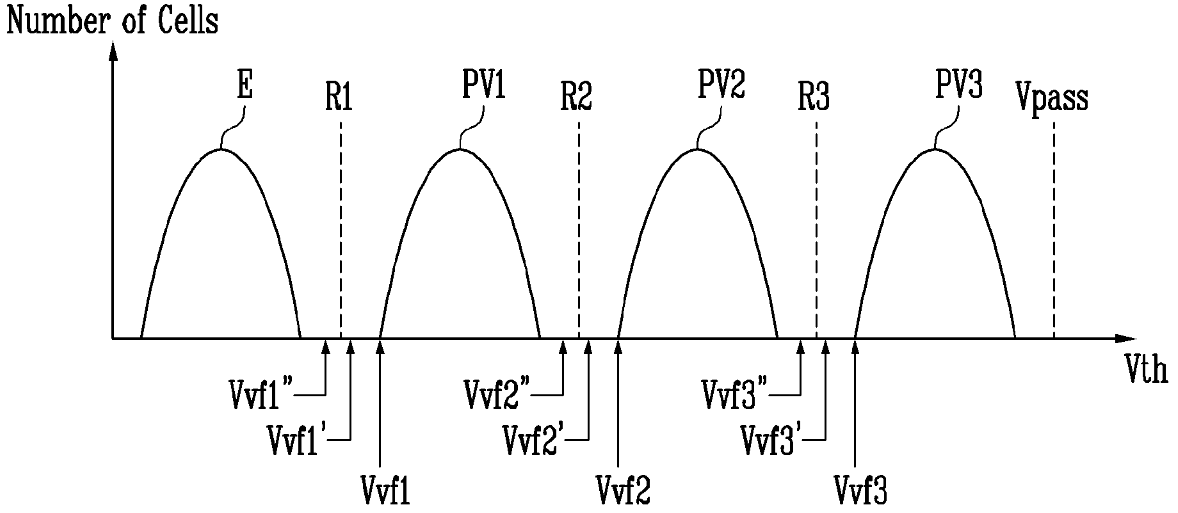
FIG. 2 is a diagram for describing threshold voltage distributions of multi-level cells (MLC), and a main verify voltage, a first sub-verify voltage, and a second sub-verify voltage for forming the threshold voltage distributions.

FIG. 2 is a diagram for describing threshold voltage distributions of multi-level cells (MLC), and a main verify voltage, a first sub-verify voltage, and a second sub-verify voltage for forming the threshold voltage distributions.

Referring to FIG. 2, threshold voltage distributions for target states corresponding to multi-level cells (MLC) are illustrated by way of example. Each of the multi-level cells (MLC) may store 2 bits of data. For this, each multi-level cell (MLC) may have a threshold voltage corresponding to one of an erase state E and first to third program states PV1 to PV3 after a program operation is performed. In order to read data from the multi-level cell (MLC), first to third read voltages R1 to R3 may be used. Meanwhile, a pass voltage Vpass may be applied to unselected word lines.

During a program verify operation, main verify voltages Vvf1, Vvf2, and Vvf3, first sub-verify voltages Vvf1', Vvf2', and Vvf3', and second sub-verify voltages Vvf1", Vvf2", and Vvf3" may be used. Each of the first sub-verify voltages Vvf1', Vvf2', and Vvf3' may be lower than the main verify voltages Vvf1, Vvf2, and Vvf3, and each of the second sub-verify voltages Vvf1", Vvf2", and Vvf3" may be lower than the first sub-verify voltages Vvf1', Vvf2', and Vvf3'.

A program method using the main verify voltages Vvf1, Vvf2, and Vvf3, the first sub-verify voltages Vvf1', Vvf2', and Vvf3', and the second sub-verify voltages Vvf1", Vvf2", and Vvf3" will be described below with reference to FIG. 3.

Figures 3, 4:
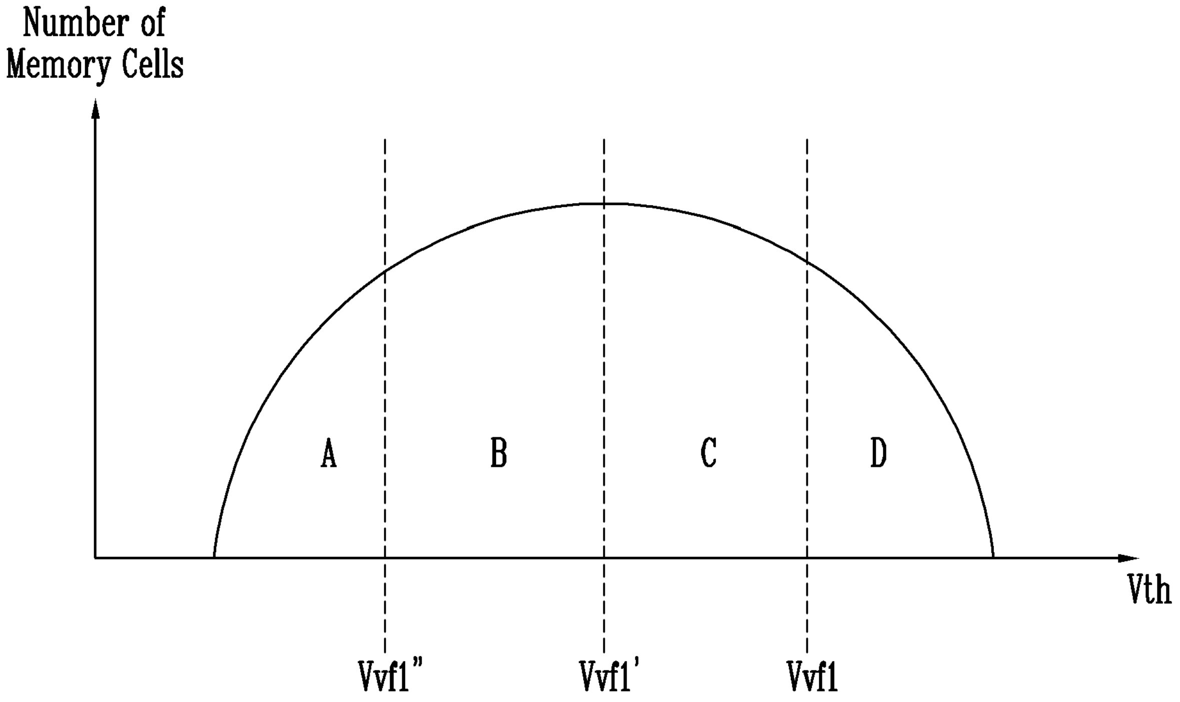
FIG. 3 is a diagram illustrating a main verify voltage, a first sub-verify voltage, and a second sub-verify voltage corresponding to a first program state, and ranges of threshold voltages of memory cells distinguished from each other by the verify voltages.
FIG. 4 is a table for describing the setting of bit line voltages of memory cells corresponding to ranges illustrated in FIG. 3.

FIG. 3 is a diagram illustrating a main verify voltage, a first sub-verify voltage, and a second sub-verify voltage corresponding to a first program state, and ranges of threshold voltages of memory cells distinguished from each other by the verify voltages. FIG. 4 is a table for describing the setting of bit line voltages of memory cells corresponding to ranges illustrated in FIG. 3. Hereinafter, voltage control for a bit line coupled to memory cells to be programmed to a first program state PV1 during a program operation will be described with reference to FIGS. 3 and 4.

Referring to FIG. 3, threshold voltage distributions of memory cells to be programmed to the first program state PV1 during the program operation are illustrated. In FIG. 3, a main verify voltage Vvf1, a first sub-verify voltage Vvf1', and a second sub-verify voltage Vvf1" corresponding to the first program state PV1 are illustrated. Memory cells to be programmed to the first program state PV1 using the main verify voltage Vvf1, the first sub-verify voltage Vvf1', and the second sub-verify voltage Vvf1" may be divided into four groups A to D. That is, memory cells D having threshold voltages higher than the main verify voltage Vvf1 have been programmed to the first program state PV1. Accordingly, as illustrated in FIG. 4, a program-inhibit voltage Vinh may be applied to a bit line $BL_D$ coupled to the memory cells D having threshold voltages higher than the main verify voltage Vvf1 in a subsequent program loop. In an embodiment, the program-inhibit voltage may be a supply voltage.

On the other hand, memory cells A, B, and C having threshold voltages lower than the main verify voltage Vvf1 have not yet been programmed to the first program state PV1. Therefore, a program-enable voltage lower than the program-inhibit voltage may be applied to bit lines $BL_A$, $BL_B$, and $BL_C$ coupled to the memory cells A, B, and C having threshold voltages lower than the main verify voltage Vvf1 in a subsequent program loop.

The program speed of the memory cells on which programming to the first program state PV1 has not yet been completed may be controlled using the first sub-verify voltage Vvf1' and the second sub-verify voltage Vvf1". That is, the range of the threshold voltage distribution corresponding to the first program state PV1 may be narrowed by reducing the width of a shift in the threshold voltages of memory cells near the main verify voltage Vvf1.

More specifically, a ground voltage VSS may be applied to the bit line $BL_A$ coupled to the memory cells A having threshold voltages lower than the second sub-verify voltage Vvf1", among the memory cells to be programmed to the first program state PV1. In an embodiment, a first program-enable voltage VREF1 may be applied to the bit line $BL_B$ coupled to the memory cells B having threshold voltages, higher than the second sub-verify voltage Vvf1" and lower than the first sub-verify voltage Vvf1', among the memory cells to be programmed to the first program state PV1. In an embodiment, the first program-enable voltage VREF1 may be a voltage higher than the ground voltage VSS and lower than the program-inhibit voltage Vinh. Further, a second program-enable voltage VREF2 may be applied to the bit line $BL_C$ coupled to the memory cells C having threshold voltages, higher than the first sub-verify voltage Vvf1' and lower than the main verify voltage Vvf1, among the memory cells to be programmed to the first program state PV1. In an embodiment, the second program-enable voltage VREF2 may be a voltage higher than the first program-enable voltage VRFE1 and lower than the program-inhibit voltage Vinh.

While a program voltage is applied to the selected word line, the threshold voltages of memory cells coupled to the bit line to which the program-inhibit voltage is applied are maintained. While the program voltage is applied to the selected word line, the width of a shift in the threshold voltages of memory cells C coupled to the bit line $BL_C$ to which the second program-enable voltage VREF2 is applied may be narrower than the width of a shift in the threshold voltages of memory cells B coupled to the bit line $BL_B$ to which the first program-enable voltage VREF1 is applied. Further, while the program voltage is applied to the selected word line, the width of a shift in the threshold voltages of the memory cells B coupled to the bit line $BL_B$ to which the first program-enable voltage VREF1 is applied may be narrower than the width of a shift in the threshold voltages of the memory cells A coupled to the bit line $BL_A$ to which the ground voltage VSS is applied.

Accordingly, the threshold voltage distribution ranges of memory cells programmed to the first program state PV1 may be narrowed by controlling the widths in shifts in the threshold voltages of the memory cells A, B, and C on which programming has not yet been completed, for respective ranges.

In the above description, although the first program state PV1 is described as an example, a program operation for the second and third program states PV2 and PV3 may be performed in the same manner as the first program state PV1.

Hereinafter, a semiconductor memory device and the operation thereof according to the present disclosure will be described based on a program operation performed on a multi-level cell (MLC) for convenience of description. However, the present disclosure is not limited thereto, and may also be applied to a program operation on a single-level cell (SLC), a triple-level cell (TLC), or the like.

Figure 5:
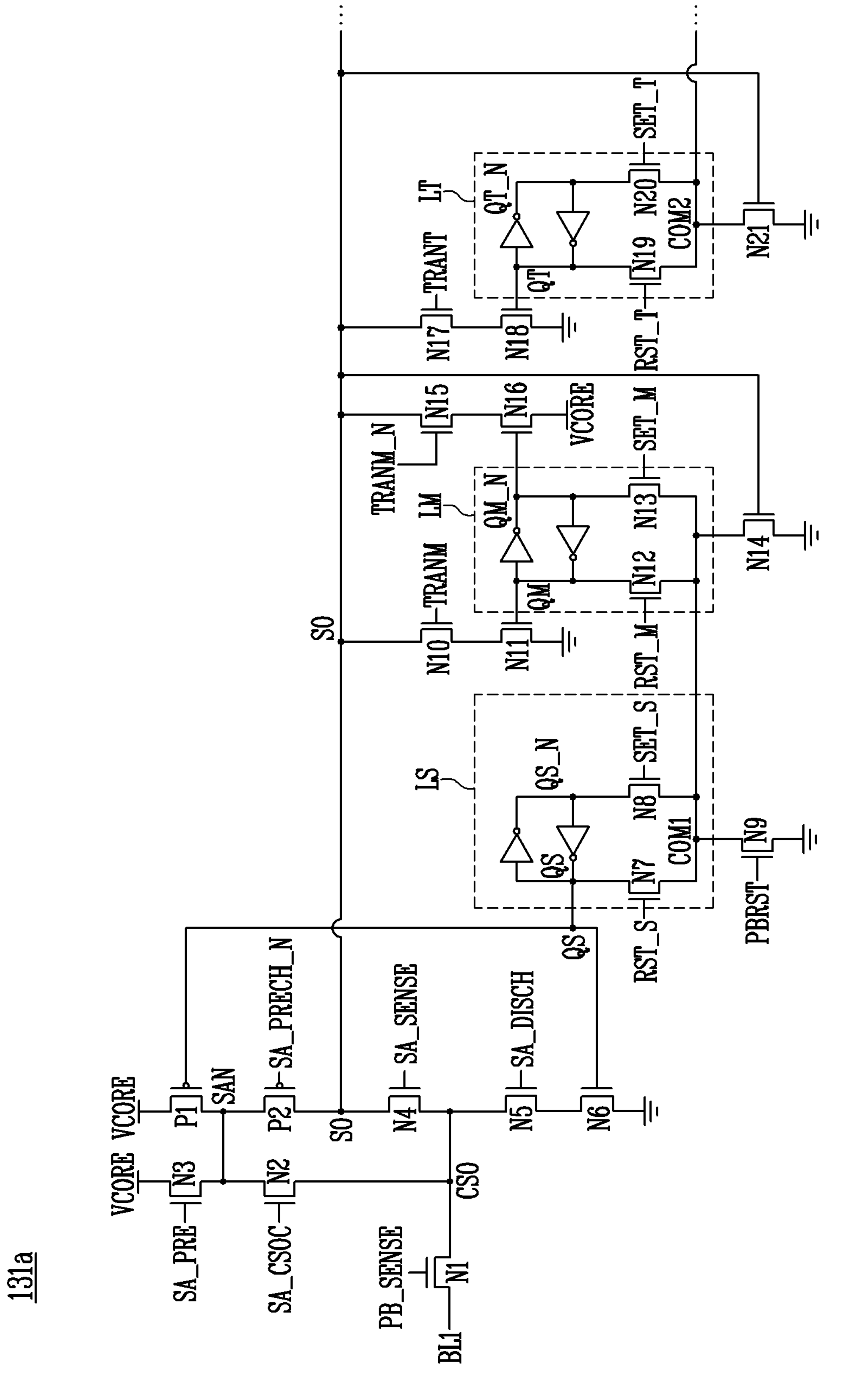
FIG. 5 is a circuit diagram illustrating a page buffer according to an embodiment of the present disclosure.

FIG. 5 is a circuit diagram illustrating a page buffer 131*a* according to an embodiment of the present disclosure.

The page buffer 131*a* may operate in response to signals output from the control logic 140. Control signals PB_SENSE, SA_PRECH_N, SA_SENSE, SA_CSOC, SA_PRE, SA_DISCH, RST_S, SET_S, RST_M, SET_M, RST_T, SET_T, TRANM, TRANM_N, TRANT, and PBRST, which will be described below, may be generated from the control logic 140. The page buffer 131*a* will be described in detail below.

Referring to FIG. 5, the page buffer 131*a* is coupled to a memory cell through a bit line BL1. Further, the page buffer 131*a* may include first to sixth NMOS transistors N1 to N6 and first and second PMOS transistors P1 and P2. Further, the page buffer 131*a* may include a first latch circuit LS, a second latch circuit LM, and a third latch circuit LT. The first latch circuit LS may include a latch coupled between nodes QS and QS_N, a seventh NMOS transistor N7 coupled between the node QS and a node COM1, and an eighth NMOS transistor N8 coupled between the node QS_N and the node COM1. The voltage value of the node QS of the first latch circuit LS and the voltage value of the node QS_N thereof may be values logically inverted to each other. That is, when the voltage value of the node QS is a logic high, the voltage value of the node QS_N may be a logic low. On the other hand, when the voltage value of the node QS is a logic low, the voltage value of the node QS_N may be a logic high.

The second latch circuit LM may include a latch coupled between nodes QM and QM_N, a twelfth NMOS transistor N12 coupled between the node QM and the node COM1, and a thirteenth NMOS transistor N13 coupled between the node QM_N and the node COM1. The page buffer 131*a* may include tenth and eleventh NMOS transistors N10 and N11 coupled in series between a node SO and a ground. Furthermore, the page buffer 131*a* may include fifteenth and sixteenth NMOS transistors N15 and N16 coupled in series between the node SO and a supply voltage VCORE terminal. Meanwhile, the page buffer 131*a* may include a fourteenth NMOS transistor N14 coupled between the node COM1 and the ground.

The third latch circuit LT may include a latch coupled between nodes QT and QT_N, a nineteenth NMOS transistor N19 coupled between the node QT and a node COM2, and a twentieth NMOS transistor N20 coupled between the node QT_N and the node COM2. The page buffer 131*a* may include seventeenth and eighteenth NMOS transistors N17 and N18 coupled in series between the node SO and the ground. The page buffer 131*a* may include a 21-st NMOS transistor N21 coupled between the node COM2 and the ground.

The page buffer 131*a* of FIG. 5 is illustrated as including three latch circuits LS, LM, and LT. However, as needed, the page buffer may include various numbers of latch circuits. For example, the page buffer may include four or more latch circuits.

Figures 6, 7:
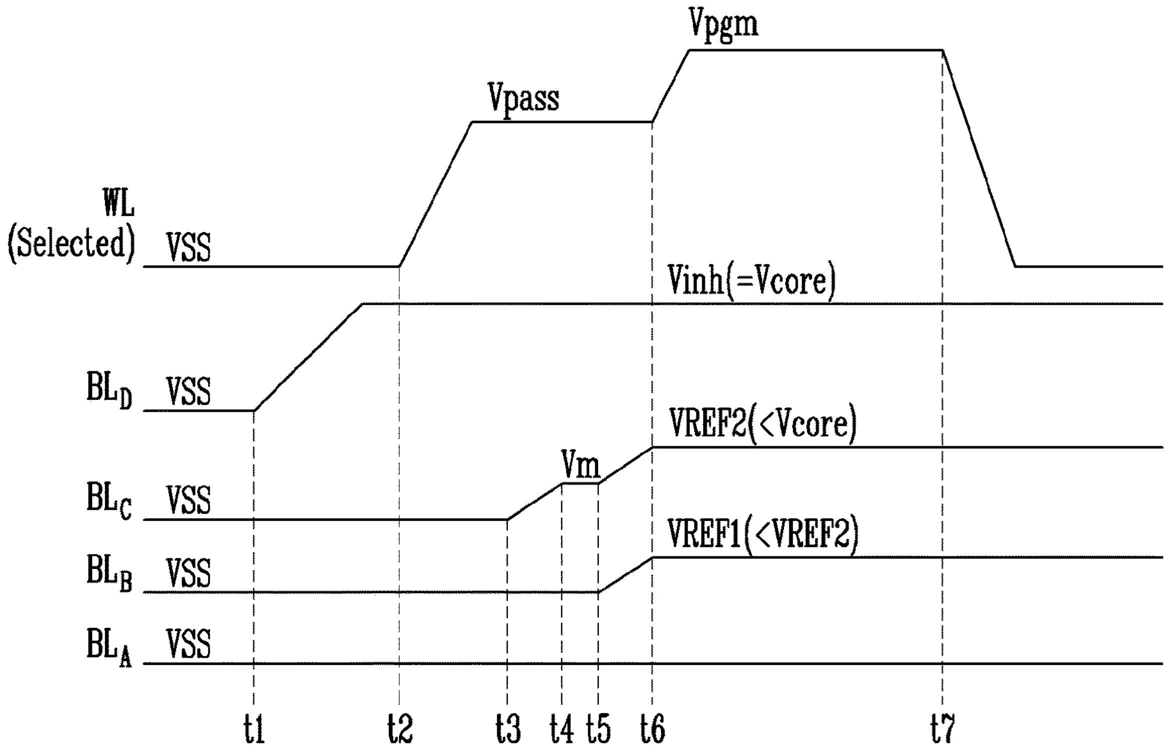
FIG. 6 is a timing diagram illustrating a first embodiment of a method of operating the page buffer illustrated in FIG. 5.
FIG. 7 is a diagram for describing a process in which values stored in latches of respective page buffers are changed after time t2 of FIG. 6.

FIG. 6 is a timing diagram illustrating a first embodiment of a method of operating the page buffer 131*a* illustrated in FIG. 5. Referring to FIG. 6, a voltage of a selected word line WL and voltages of bit lines coupled to memory cells falling within respective ranges illustrated in FIG. 3 are illustrated. In FIG. 6, illustration of a voltage of unselected word lines is omitted.

In the initial stage of a program operation, the ground voltage VSS may be applied to the word line and bit lines. At time t1, the voltage of a bit line $BL_D$ may start to rise to the program-inhibit voltage Vinh. At time t2, the voltage of the selected word line may start to rise to a pass voltage Vpass. Although not illustrated in FIG. 6, the voltages of the unselected word lines may also start to rise to the pass voltage Vpass at time t2.

At time t3, the voltage of a bit line $BL_C$ may start to rise. At time t4, the voltage of the bit line $BL_C$ may become an intermediate voltage Vm. Thereafter, at time t5, the voltages of a bit line $BL_B$ and the bit line $BL_C$ may start to rise. At time t6, the voltage of the bit line $BL_B$ may become the first program-enable voltage VREF1, and the voltage of the bit line $BL_C$ may become the second program-enable voltage VREF2. Meanwhile, the voltage of a bit line $BL_A$ may be maintained at the ground voltage VSS.

At time t6, the voltage of the selected word line may start to rise to the program voltage Vpgm. Accordingly, the threshold voltages of the memory cells A, B, and C, other than the memory cells D coupled to the bit line $BL_D$ to which the program-inhibit voltage Vinh is applied, may rise. In this case, because the voltages of the bit lines $BL_A$, $BL_B$, and $BL_C$ coupled to the memory cells A, B, and C, respectively, are different from each other, the widths of shifts in the threshold voltages of the memory cells A, B, and C may be changed during a period from t6 to t7. That is, during the period from t6 to t7, the threshold voltages of the memory cells A may rise at the highest increase rate. The rate of increase in the threshold voltages of the memory cells B is less than the rate of increase in the threshold voltages of the memory cells A. Further, the rate of increase in the threshold voltages of the memory cells C is less than the rate of increase in the threshold voltages of the memory cells B.

In accordance with the embodiment illustrated in FIG. 6, the voltages of the bit lines $BL_B$ and $BL_C$ are set through a two-step process. A first step may correspond to a period from t3 to t4, during which the voltage of the bit line $BL_C$ rises to the intermediate voltage Vm. Meanwhile, a second step may correspond to a period from t5 to t6, during which the voltages of the bit lines $BL_B$ and $BL_C$ may rise together.

FIG. 7 is a diagram for describing a process in which values stored in latches of respective page buffers are changed after time t2 of FIG. 6.

In accordance with an embodiment of the present disclosure, values stored in latches of respective page buffers before time t2, may be different from each other depending on the threshold voltages of the memory cells. That is, respective logic values indicated by voltages of nodes QS_N, QM_N, and QT_N of the latch circuits LS, LM, and LT in the page buffer that is coupled to the memory cells A having threshold voltages, lower than the second sub-verify voltage Vvf1", may be "0, 0, 0." Meanwhile, respective logic values indicated by voltages of nodes QS_N, QM_N, and QT_N of the latch circuits LS, LM, and LT in the page buffer that is coupled to the memory cells B having threshold voltages, higher than the second sub-verify voltage Vvf1" and lower than the first sub-verify voltage Vvf1', may be "0, 0, 1." Furthermore, respective logic values indicated by the voltages of nodes QS_N, QM_N, and QT_N of the latch circuits LS, LM, and LT in the page buffer that is coupled to the memory cells C having threshold voltages, higher than the first sub-verify voltage Vvf1' and lower than the main verify voltage Vvf1, may be "0, 1, 1." Finally, respective logic values indicated by the voltages of nodes QS_N, QM_N, and QT_N of the latch circuits LS, LM, and LT in the page buffer that is coupled to the memory cells D having threshold voltages, higher than the main verify voltage Vvf1, may be "1, 1, 1."

At time t1, based on the voltages of the nodes QS_N, QM_N, and QT_N of the latch circuits LS, LM, and LT in the page buffer, the voltage of the bit line $BL_D$ coupled to the memory cells D having threshold voltages, higher than the main verify voltage Vvf1 may start to rise to the program-inhibit voltage Vinh.

After the voltage of the bit line $BL_D$ has risen to the program-inhibit voltage Vinh, bit data stored in the third latch circuit LT may be transferred to the first latch circuit LS at time t2. Accordingly, the voltage of the node QS_N of the first latch circuit LS included in each page buffer may become equal to that of the node QT_N of the third latch circuit LT.

After time t3, the voltages of the bit lines $BL_B$ and $BL_C$ may be changed using the changed voltage values of the nodes QS_N, QM_N, and QT_N of the latch circuits LS, LM, and LT. Below, description will be made in detail with reference to FIG. 8.

Figure 8:
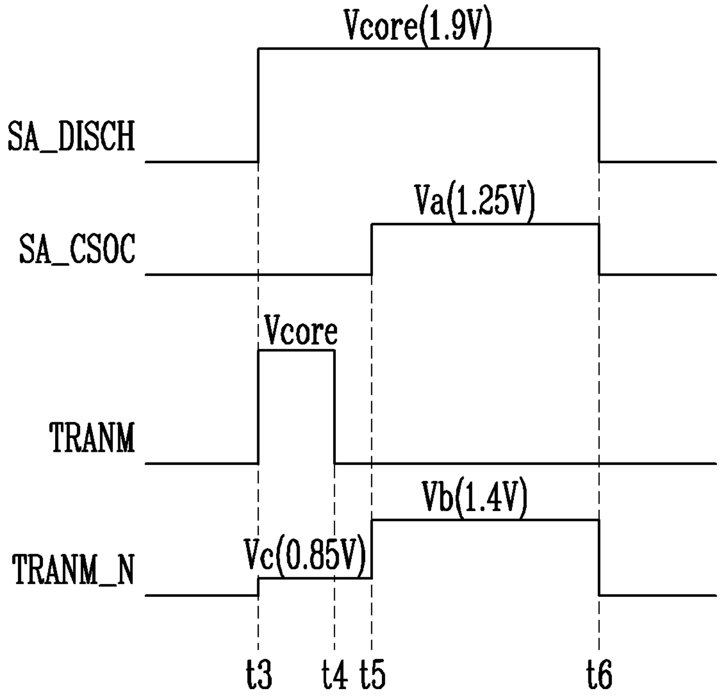
FIG. 8 is a timing diagram for describing the detailed operation of a page buffer during a period from t3 to t6 in FIG. 6.

FIG. 8 is a timing diagram for describing the detailed operation of a page buffer during a period from t3 to t6 in FIG. 6.

At time t3, the signal SA_DISCH may be activated at a level of the supply voltage Vcore, whereby the fifth NMOS transistor N5 may be turned on. Accordingly, the voltage of the node CSO may be changed due to the voltage of the node QS. For example, when the page buffer is coupled to a memory cell in region (range) A, the node QS_N has a logic low voltage corresponding to a value of 0, as shown in FIG. 7, and thus the node QS has a logic high voltage. Therefore, the sixth NMOS transistor N6 may be turned on, whereby the node CSO may be coupled to the ground. In this case, the first PMOS transistor P1 may be turned off.

On the other hand, when the page buffer is coupled to a memory cell in region (range) B, C, or D, the node QS_N has a logic high voltage corresponding to a value of 1, as shown in FIG. 7, and thus the node QS has a logic low voltage. Therefore, the sixth NMOS transistor N6 is turned off, whereby the node CSO is not coupled to the ground. In this case, the first PMOS transistor P1 may be turned on.

In an embodiment, the supply voltage Vcore may be about 1.9 V.

At time t3, the signal TRANM may be activated at a level of the supply voltage Vcore, whereby the tenth NMOS transistor N10 may be turned on. Accordingly, the voltage of the node SO may be changed due to the voltage of the node QM. For example, when the page buffer is coupled to a memory cell in region (range) A or B, the node QM_N has a logic low voltage corresponding to a value of 0, as shown in FIG. 7, and thus the node QM has a logic high voltage. Therefore, the eleventh NMOS transistor N11 may be turned on, whereby the node SO may be coupled to the ground.

On the other hand, when the page buffer is coupled to a memory cell in region (range) C, or D, the node QM_N has a logic high voltage corresponding to a value of 1, as shown in FIG. 7, and thus the node QM has a logic low voltage. Therefore, the eleventh NMOS transistor N11 is turned off, whereby the node SO is not coupled to the ground.

Furthermore, at time t3, the signal TRANM_N may be weakly activated at a level of a voltage Vc. Here, the voltage Vc may be determined by the following Equation (1).

$$Vc = VREF2 + Vth1 - VREF1 \tag{1}$$

In Equation (1), VREF1 and VREF2 are the first and second program-enable voltages, and Vth1 is a threshold voltage of the fifteenth NMOS transistor N15.

Thereafter, at time t4, the signal TRANM may be deactivated at a level of a ground voltage. Therefore, at time t4, the node SO may float.

Thereafter, at time t5, the signal SA_CSOC may be activated at a level of a voltage Va. Here, the voltage Va may be determined by the following Equation (2).

$$Va = VREF1 + Vth2 \tag{2}$$

In Equation (2), VREF1 is the first program-enable voltage, and Vth2 is a threshold voltage of the second NMOS transistor N2.

At time t5, the signal TRANM_N may be activated at a level of a voltage Vb. Here, the voltage Vb may be determined by the following Equation (3).

$$Vb = VREF2 + Vth1 \tag{3}$$

In Equation (3), VREF2 is the second program-enable voltage, and Vth1 is the threshold voltage of the fifteenth NMOS transistor N15.

In the embodiment illustrated in FIG. 8, a period from t3 to t4 may correspond to the step of partially raising the voltage of the bit line $BL_C$, and a period from t5 to t6 may correspond to the step of raising the voltages of the bit lines $BL_B$ and $BL_C$ together.

Through the above-described process, voltages to be applied to the bit lines $BL_B$ and $BL_C$ may be set, as illustrated in the period from t3 to t6 in FIG. 6.

Figure 9:
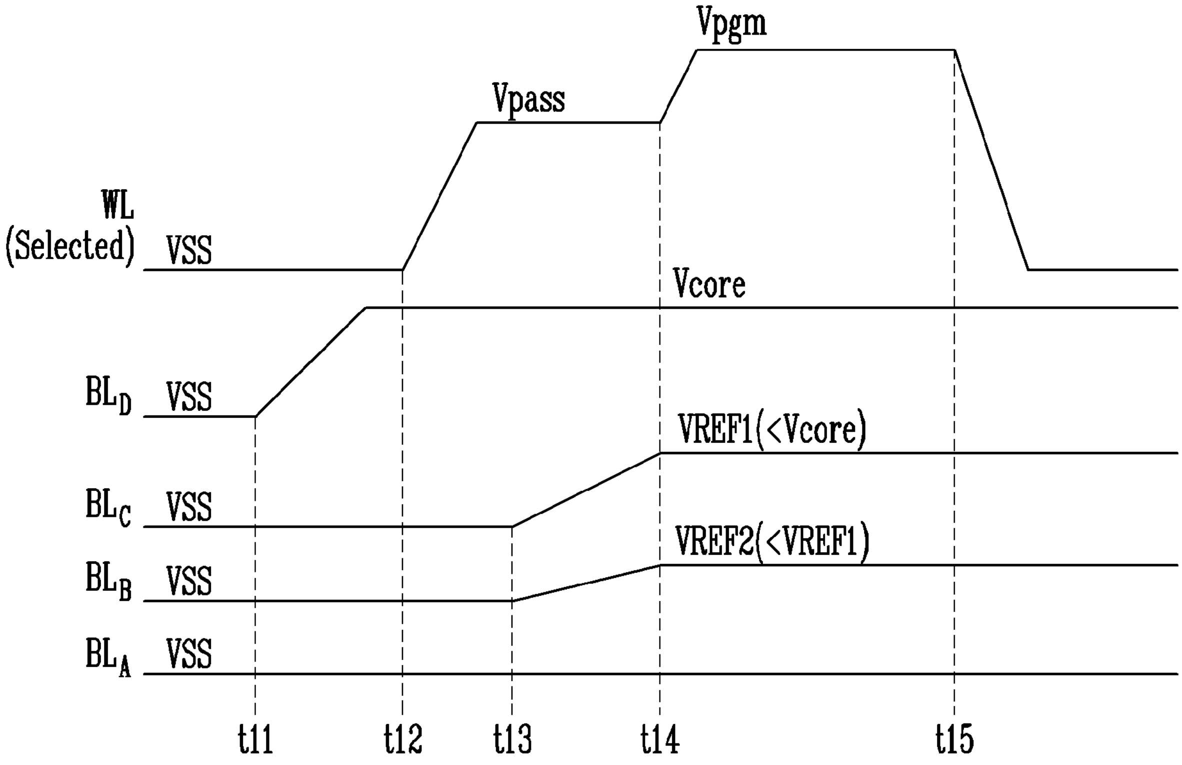
FIG. 9 is a timing diagram illustrating a second embodiment of a method of operating the page buffer illustrated in FIG. 5.

FIG. 9 is a timing diagram illustrating a second embodiment of a method of operating the page buffer 131*a* illustrated in FIG. 5.

Referring to FIG. 9, the voltage of the selected word line WL and the voltages of bit lines coupled to memory cells falling within respective ranges illustrated in FIG. 3 are illustrated. Similar to FIG. 6, illustration of the voltages of unselected word lines is omitted in FIG. 9.

In the initial stage of a program operation, the ground voltage VSS may be applied to the word line and bit lines. At time t11, the voltage of a bit line $BL_D$ may start to rise to the program-inhibit voltage Vinh. At time t12, the voltage of the selected word line may start to rise to the pass voltage Vpass. Meanwhile, the voltages of unselected word lines may also start to rise to the pass voltage Vpass at time t12.

At time t13, the voltages of the bit lines $BL_C$ and $BL_D$ may start to simultaneously rise. At time t14, the voltage of the bit line $BL_B$ may become the second program-enable voltage VREF2, and the voltage of the bit line $BL_C$ may become the first program-enable voltage VREF1. Meanwhile, the voltage of a bit line $BL_A$ may be maintained at the ground voltage VSS.

At time t14, the voltage of the selected word line may start to rise to the program voltage Vpgm. Accordingly, the threshold voltages of the memory cells A, B, and C, other than the memory cells D coupled to the bit line $BL_D$ to which the program-inhibit voltage Vinh is applied, may rise.

Figure 10:
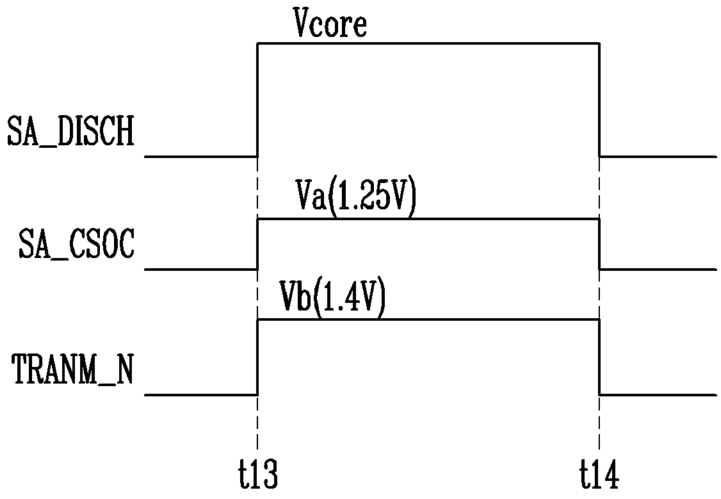
FIG. 10 is a timing diagram for describing the detailed operation of a page buffer during a period from t13 to t14 in FIG. 9.

FIG. 10 is a timing diagram for describing the detailed operation of a page buffer during a period from t13 to t14 in FIG. 9.

At time t13, the signal SA_DISCH may be activated at a level of the supply voltage Vcore, and thus the fifth NMOS transistor N5 may be turned on. In an embodiment, the supply voltage Vcore may be about 1.9 V. Meanwhile, at time t13, the signal SA_CSOC may be activated at a level of a voltage Va. Here, the voltage Va may be determined by the above-described Equation (2). Further, at time t13, the signal TRANM_N may be activated at a level of a voltage Vb. Here, the voltage Vb may be determined by the above-described Equation (3).

Through the foregoing process, voltages to be applied to the bit lines $BL_B$ and $BL_C$ may be set, as illustrated in the period from t13 to t14 in FIG. 9.

In accordance with embodiments of the present disclosure, a semiconductor memory device can set bit line voltages so that first and second sub-verify operations and a main verify operation are performed.

While the present disclosure has been shown and described with reference to certain embodiments thereof, it will be understood by those skilled in the art that various changes in form and details may be made therein without departing from the spirit and scope of the present disclosure as defined by the appended claims and their equivalents. Therefore, the scope of the present disclosure should not be limited to the above-described embodiments but should be determined by not only the appended claims but also the equivalents thereof.

In the above-described embodiments, all operations may be selectively performed or part of the operations may be omitted. In each embodiment, the operations are not necessarily performed in accordance with the described order and may be rearranged. The embodiments disclosed in this specification and drawings are only examples to facilitate an understanding of the present disclosure, and the present disclosure is not limited thereto. That is, it should be apparent to those skilled in the art that various modifications can be made on the basis of the technological scope of the present disclosure.

Moreover, the embodiments of the present disclosure have been described in the drawings and specification. Although specific terminologies are used here, those are only to describe the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein and the following claims. Furthermore, the embodiments may be combined to form additional embodiments.

What is claimed is:

1. A semiconductor memory device comprising:

a memory cell array including a plurality of memory cells;

a plurality of page buffers coupled to the plurality of memory cells through a plurality of bit lines; and a control logic configured to control each of the plurality of page buffers during a program operation, wherein each of the plurality of page buffers comprises:

a first latch circuit configured to store first data corresponding to a main verification result obtained using a main verify voltage;

a second latch circuit configured to store second data corresponding to a first sub-verification result obtained using a first sub-verify voltage lower than the main verify voltage; and a third latch circuit configured to store third data corresponding to a second sub-verification result obtained using a second sub-verify voltage lower than the first sub-verify voltage, wherein each of the plurality of page buffers is configured to:

apply a program-inhibit voltage to a bit line coupled to program-completed memory cells, using the first data stored in the first latch circuit; and store the third data, stored in the third latch circuit, in the first latch circuit after the program-inhibit voltage is applied, wherein the main verify voltage, the first sub-verify voltage and the second sub-verify voltage are used to verify a threshold voltage of a memory cell to be programmed to a same program state, wherein each of the page buffers further comprises:

a first NMOS transistor coupled between a corresponding bit line and a first node;

a second NMOS transistor coupled between the first node and a second node;

a third NMOS transistor coupled between a supply voltage terminal and the second node;

a first PMOS transistor coupled between the supply voltage terminal and the second node;

a second PMOS transistor coupled between the second node and a sensing node;

a fourth NMOS transistor coupled between the sensing node and the first node; and fifth and sixth NMOS transistors coupled in series between the first node and a ground, and wherein a first data node of the first latch circuit is coupled to a gate of the first PMOS transistor and a gate of the sixth NMOS transistor.

2. The semiconductor memory device according to claim 1, wherein, after the third data is stored in the first latch circuit, each of the page buffers is configured to:

raise a voltage of a bit line coupled to memory cells having threshold voltages, lower than the first sub-verify voltage and higher than the second sub-verify voltage, to an intermediate level using the second data; and raise a voltage of a bit line coupled to memory cells having threshold voltages, lower than the main verify voltage and higher than the first sub-verify voltage, to a second intermediate level higher than the intermediate level using the third data stored in the third latch circuit and the second data.

3. The semiconductor memory device according to claim 1, wherein, after the third data is stored in the first latch circuit, each of the page buffers is configured to raise a voltage of a bit line coupled to memory cells having threshold voltages, lower than the main verify voltage and higher than the first sub-verify voltage, to the second intermediate level using the third data stored in the third latch circuit and the second data.

4. The semiconductor memory device according to claim 1, wherein the first latch circuit comprises:

a first latch coupled between the first data node and a first inverted data node;

a seventh NMOS transistor coupled between the first data node and a first common node; and an eighth NMOS transistor coupled between the first inverted data node and the first common node.

5. The semiconductor memory device according to claim 4, wherein each of the page buffers further comprises a ninth NMOS transistor coupled between the first common node and the ground.

6. The semiconductor memory device according to claim 5, wherein each of the page buffers further comprises tenth and eleventh NMOS transistors coupled in series between the sensing node and the ground, wherein the second latch circuit comprises:

a second latch coupled between a second data node and a second inverted data node;

a twelfth NMOS transistor coupled between the second data node and the first common node; and a thirteenth NMOS transistor coupled between the second inverted data node and the first common node, and wherein the second data node is coupled to a gate of the eleventh NMOS transistor.

7. A page buffer comprising:

a first latch circuit configured to store, during a program operation, first data corresponding to a main verification result obtained using a main verify voltage;

a second latch circuit configured to store, during the program operation, second data corresponding to a first sub-verification result obtained using a first sub-verify voltage lower than the main verify voltage; and a third latch circuit configured to store, during the program operation, third data corresponding to a second sub-verification result obtained using a second sub-verify voltage lower than the first sub-verify voltage, wherein, during the program operation, the page buffer controls the first to third latch circuits by:

applying a program-inhibit voltage to a bit line coupled to program-completed memory cells, using the first data stored in the first latch circuit;

storing, in the first latch circuit, the third data stored in the third latch circuit;

raising a voltage of a bit line coupled to memory cells having threshold voltages, lower than the first sub-verify voltage and higher than the second sub-verify voltage, to an intermediate level using the second data; and raising a voltage of a bit line coupled to memory cells having threshold voltages, lower than the main verify voltage and higher than the first sub-verify voltage, to a second intermediate level higher than the intermediate level using the third data stored in the third latch circuit and the second data, wherein the main verify voltage, the first sub-verify voltage and the second sub-verify voltage are used to verify a threshold voltage of a memory cell to be programmed to a same program state, wherein the page buffer further comprises:

a first NMOS transistor coupled between a corresponding bit line and a first node;

a second NMOS transistor coupled between the first node and a second node;

a third NMOS transistor coupled between a supply voltage terminal and the second node;

a first PMOS transistor coupled between the supply voltage terminal and the second node;

a second PMOS transistor coupled between the second node and a sensing node;

a fourth NMOS transistor coupled between the sensing node and the first node; and fifth and sixth NMOS transistors coupled in series between the first node and a ground, and wherein a first data node of the first latch circuit is coupled to a gate of the first PMOS transistor and a gate of the sixth NMOS transistor.

8. A page buffer comprising:

a first latch circuit configured to store, during a program operation, first data corresponding to a main verification result obtained using a main verify voltage;

a second latch circuit configured to store, during the program operation, second data corresponding to a first sub-verification result obtained using a first sub-verify voltage lower than the main verify voltage; and a third latch circuit configured to store, during the program operation, third data corresponding to a second sub-verification result obtained using a second sub-verify voltage lower than the first sub-verify voltage, wherein, during the program operation, the page buffer controls the first to third latch circuits by:

applying a program-inhibit voltage to a bit line coupled to program-completed memory cells, using the first data stored in the first latch circuit;

storing, in the first latch circuit, the third data stored in the third latch circuit; and raising a voltage of a bit line coupled to memory cells having threshold voltages, lower than the main verify voltage and higher than the second sub-verify voltage, to an intermediate level lower than the program-inhibit voltage using the third data stored in the third latch circuit and the second data, wherein the main verify voltage, the first sub-verify voltage and the second sub-verify voltage are used to verify a threshold voltage of a memory cell to be programmed to a same program state, wherein the page buffer further comprises:

a first NMOS transistor coupled between a corresponding bit line and a first node;

a second NMOS transistor coupled between the first node and a second node;

a third NMOS transistor coupled between a supply voltage terminal and the second node;

a first PMOS transistor coupled between the supply voltage terminal and the second node;

a second PMOS transistor coupled between the second node and a sensing node;

a fourth NMOS transistor coupled between the sensing node and the first node; and fifth and sixth NMOS transistors coupled in series between the first node and a ground, and wherein a first data node of the first latch circuit is coupled to a gate of the first PMOS transistor and a gate of the sixth NMOS transistor.

* * * * *